United States Patent [19]

Benbow et al.

[11] 4,307,341
[45] Dec. 22, 1981

[54] CLUTCH MECHANISM FOR TIME OF DAY WATT DEMAND METER REGISTERS

[75] Inventors: Eugene C. Benbow; Kenneth G. Halstead, both of Raleigh, N.C.

[73] Assignee: Westinghouse Electric Corp., Pittsburgh, Pa.

[21] Appl. No.: 102,499

[22] Filed: Dec. 11, 1979

[51] Int. Cl.³ .................... G01R 19/16; F16D 19/00
[52] U.S. Cl. ............................. 324/103 R; 192/20; 192/89 A
[58] Field of Search ............. 324/103 R; 192/20, 89 A

[56] References Cited

U.S. PATENT DOCUMENTS

| | | | |
|---|---|---|---|
| 1,405,927 | 2/1922 | Lauth | 192/89 A |
| 1,985,422 | 12/1934 | Pearlman | 192/89 A |
| 2,259,314 | 10/1941 | Lewis et al. | 324/103 R |
| 2,859,924 | 11/1958 | Sarah | 192/89 A |
| 3,406,338 | 10/1968 | Benbow | 324/103 R |
| 3,913,014 | 10/1975 | Halstead et al. | 324/103 R |

Primary Examiner—Ernest F. Karlsen
Attorney, Agent, or Firm—D. R. Lackey

[57] ABSTRACT

A clutch mechanism for watt demand meter registers includes a clutch driving part continuously driven by a rotating measuring element so as to be freely rotatable when the clutch is open. The driving part is mounted between a clutch driven part and a clutch closing part which clamps the clutch parts together when the clutch mechanism is closed.

7 Claims, 3 Drawing Figures

CLUTCH MECHANISM FOR TIME OF DAY WATT DEMAND METER REGISTERS

BACKGROUND OF THE INVENTION

This invention relates to a watt demand dial register having a clutch mechanism for periodically uncoupling a dial indicator from a rotatable measuring element driving in response to variations of a quantity to be measured.

Dial registers are typically used in various types of meters for indicating the consumption of different quantities to be measured. In electric energy meters, a disk and shaft assembly that is electromagnetically driven. The assembly forms a measuring element which is rotatable at the rate of consumption of electric energy. The rotations are coupled by one or more register gear trains to dial pointers indicating kilowatt demand of power usage. When measurements are to be made only during preselected time intervals, such as for only a part of each day, the dial pointers must remain uncoupled from the measuring element while it continues to rotate. A clutch mechanism is required to be provided in the register to selectively couple and uncouple the dial pointers. Many prior art register clutch mechanisms produced additional frictional drag or additional rotational torque loading on the rotatable measuring element while the clutch is uncoupled. The mechanical loading on the register gear trains cause them to wear excessively and substantially shorten the operational lifetime of the register. The substantial variations in loads on the rotatable measuring element during measuring and non-measuring times can cause it to become unstable, produce excessive wear on the disc shaft bearing and substantially reduce the operational lifetime of the measuring element.

In U.S. Pat. No. 3,406,338, issued Oct. 15, 1968, a maximum watt demand meter is disclosed including a block interval demand register having a clutch mechanism which is open briefly at the end of each demand measuring interval, which may be every fifteen, thirty or sixty minutes. A clutch driving member includes a sleeve which carries an input gear at one end and a frictional clutch surface at the other end. The driving member is uncoupled from a driven member when it is engaged by an operator member formed by a trip lever or arm member having a fork configuration. The driving member is shifted axially by the trip lever to be disengaged and uncoupled from the driven clutch member. The clutch is only opened or disengaged for two to five seconds. The additional frictional and rotational forces on the driven member due to being shifted to the open position is not applied sufficiently long to take up the backlash on the associated gear train connected to it. If the clutch mechanism were to be held open for a substantial time, as required in on and off peak or time of day demand registers, for example, the additional loading on the clutch driving member would be coupled to the gear train and/or the rotations of the measuring element.

One example of an on-peak off-peak watt demand register is described and claimed in U.S. Pat. No. 3,913,014, issued Oct. 14, 1975. The register in the aforementioned patent includes selective coupling and uncoupling with the demand measuring gear train by demeshing a pair of gears in accordance with a programmed cam surface. Misalignment of mating gears can retard the return to the mutually meshed relationship. A pusher drive and reset mechanism utilizing an additional clutch mechanism is suggested for use in the aforementioned patent in which such clutch mechanism is described in U.S. Pat. No. 2,259,314, issued Oct. 14, 1941.

SUMMARY OF THE INVENTION

An improved clutch mechanism for time of day watt demand registers made in accordance with this invention, includes a three part arrangement mounted along a common axis provided by a shaft. A clutch driven part has a fixed axial position and is rotatable for effecting movement of a watt demand dial pointer indicator. A clutch driving part is continuously coupled through a gear train to a rotatable measuring element and the driving part is axially shiftable for disengagement and frictional engagement of the clutch driven part while being freely rotatable about the common axis. A clutch closing part is axially biased toward the clutch driving part for effecting the coupled engagement between the clutch driving and driven parts. The clutch closed position effects rotational coupling through the clutch between the rotatable measuring element and the dial pointer indicator. A clutch operator is effective to axially shift the clutch closing part and release the clutch driving part from its driving engagement with the driven part.

An important feature of the present invention is to provide an improved clutch mechanism for watt demand registers that couples and uncouples a rotatable measuring element with a dial indicator so that a clutch driving part produces low or negligible torque on the register gear train and measuring element when the clutch is held open for extended periods.

DETAILED DESCRIPTION OF THE PREFERRED EMBODIMENTS

Figure 1:
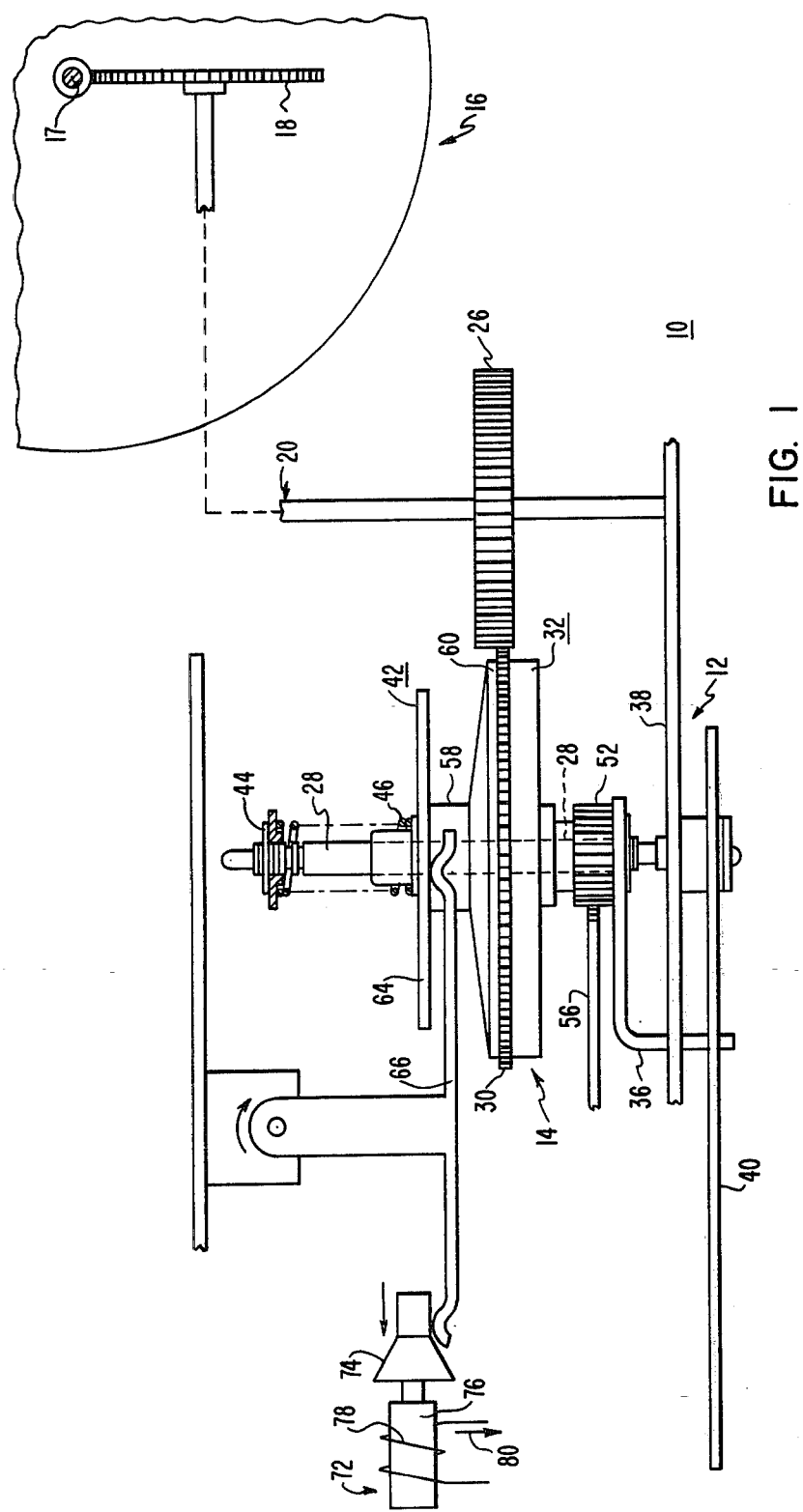
FIG. 1 is a top plan view of a portion of a time of day watt demand register including an improved clutch mechanism made in accordance with the present invention and further includes a diagrammatic showing of associated parts of an electric energy meter utilizing the register.

Referring now to the drawing and more particularly to FIG. 1, an electric energy meter 10 is shown therein including a time of day maximum watt demand register 12 including an improved clutch mechanism 14 made in accordance with the present invention. For purposes of description and not limitation, the clutch mechanism 14 is shown replacing the clutch of a maximum demand device disclosed and claimed in the aforementioned U.S. Pat. No. 3,406,338.

The meter 10 includes a watthour metering movement of the induction or electromechanical type having a rotatable measuring element 16 formed by a shaft supported conductive disk. As is understood by those skilled in the watthour meter art, the disc and shaft are rotated or driven electromagnetically at a rate proportional to the rate of consumption of an electric energy quantity to be measured. In a known manner, a worm wheel 18 is driven by the shaft of the measuring element 16 to couple its rotations to a gear train 20 of the register 12. The gear train 20 includes a wide gear 26 being continuously coupled to the input of the clutch mechanism 14 as described hereinbelow.

The clutch mechanism 14 has a three part arrangement and is carried on a shaft 28 so as to be coaxially aligned with the longitudinal axis of the shaft 28. A clutch driving part 30 is axially slidable and rotatably mounted on the shaft 28. The driving part 30 is substantially a thin disc having the outer periphery thereof formed by gear teeth continuously meshing with the gear 26. A clutch driven part 32 is rotatable and axially restrained on the forward end of the shaft 28 between a pair of shaft mounted retaining rings so as to rotate on the shaft while having a fixed axial position thereon. A resettable pusher member 36 is fixedly carried on a forward part of the driven part 32 and extends through a dial plate 38 of the register 12. The pusher member 36 is engageable with and actuates a maximum watt demand dial pointer indicator 40 pivotally mounted on the front face of the dial plate 38. The forward end of the shaft 28 is mounted in a thrust bearing rearward of the pivotal mounting of the indicator 40. The clutch mechanism 14 further generally includes a clutch closing member 42 mounted in a rotatable and axially shiftable relationship on the shaft 28. In the closed position of the clutch mechanism 14 as shown in FIG. 1, the clutch driving part 30 is clamped between the closing part 42 and the clutch driven part 32 to couple the continuous metering responsive rotations of the gear 26 to the pusher member 36.

The shaft 28 is supported in the register 12 for being rotatable and carrying the clutch mechanism 14 and extends rearward of the dial plate 38 as described hereinabove. A further retainer ring 44 is provided at the rear end of the shaft 28 and is applied to one of a series of grooves in the rear end of the shaft 28. A helical spring 46 is compressed between the retainer 44 and the clutch part 42. The spring 46 normally biases the clutch part 42 toward and against the driving part 30 to produce a clamping force or pressure to effect the clutch closed position.

The clutch parts 30, 32 and 42 of the clutch mechanism 14 are arranged so that the driving part 30 provides a gear input to the clutch mechanism as described above, and has a thin gear configuration for continuously meshing with the gear 26 as it is shifted on the shaft 28. The continuous meshing of the gear teeth around the outer periphery of the part 30 with the teeth of the gear 26 when the clutch is moved between the axial extents of the axial slidable movement thereof avoids any problem of initially meshing the gear teeth which could occur if they become separated. Thus, the gear train 20 is continuously coupled to the rotations of the rotatable measuring element 16 and to the clutch driving part 30. Only the eccentricity of the thin clutch part 30 is critical so that the clutch mechanism 14 is simple to assemble and has more accuracy than if the clutch driving part includes an extended sleeve carrying an actuating end and an input gear.

The forward radial side of the clutch part 30 includes a flat friction clutch surface for coupling engagement with a mating flat friction clutch surface of a rear flat radial side surface formed on a plate portion 50 (shown in FIG. 2) of the driven part 32. A pinion gear 52 is carried in an integrally attached relationship with the plate portion 50 of the part 32. The pinion gear 52 is engaged by a sector gear 56. The clutch part 32 is held axially in place relative to the shaft 28 by a snap ring, not shown, fitted into a center recess of the plate portion 50. Thus, the plate 50, gear 52 and pusher member 36 rotate in unison. The sector gear 56 returns the clutch part 32 and pusher member 36 to a reset or an initial measuring position when the clutch mechanism is opened. The resetting operation is in accordance with the operation of a block interval demand register in which the pusher member 36 is reset at the end of a predetermined demand measuring interval or period such as fifteen, thirty or sixty minutes. The pusher resetting operation is described in the aforementioned U.S. Pat. Nos. 3,406,338 and 2,259,314.

The clutch closing member 42 includes a sleeve 58 having a forward pressure applying plate 60 having substantially the same diameter as the plate 50 of the clutch part 32. A forward flat radial side surface of the plate 60 engages and presses against the rearward side radial surface of the driving part 30. Thus engaged, the clutch part 30 is clamped in a sandwiched relationship between the clutch parts 32 and 42 in the closed position and coupling condition of the clutch mechanism 14. The eccentricity of the center hole of the sleeve 58 of the clutch part 42 is not critical since it is only required to provide rotating and slidable movement for applying axial pressure to the mutually engaging surfaces of the clutch parts 30 and 32. The rearward end of the clutch part 42 includes a flange 64 integrally carried on the rear end of the sleeve 58 and the helical spring 44 engages it to thereby bias the clutch part 42.

Figure 2:
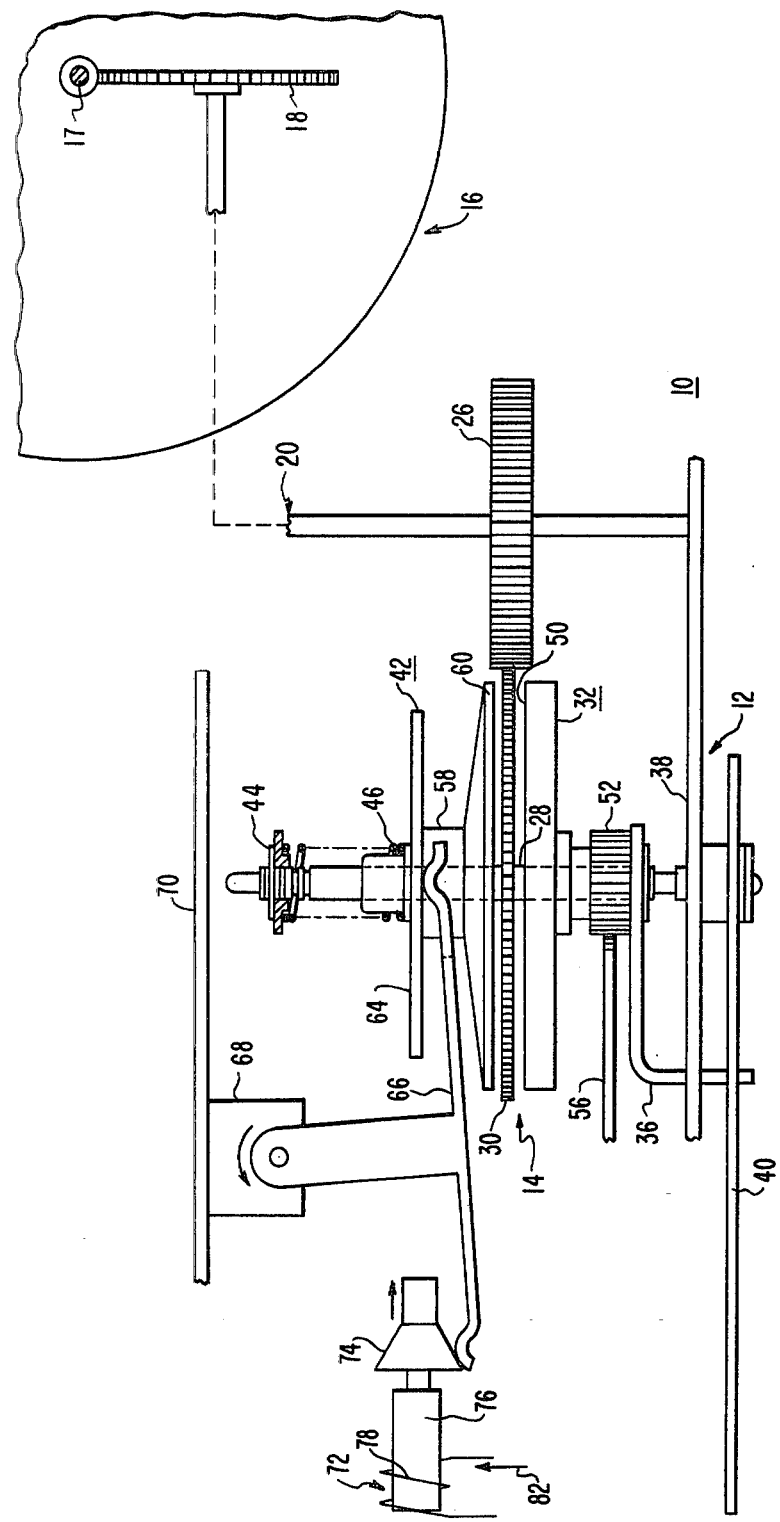
FIG. 2 is a top plan view of a portion of FIG. 1 showing the improved clutch mechanism in a different operative position.

A clutch operating arrangement is provided by a trip lever or arm 66 mounted at a pivot 68 carried by a mounting plate 70 of the register 12. The right-hand or driving end of the lever 66 has a fork configuration defining tines extending over the sleeve 58 so that the ends of the tines are releasably engageable with a front flat radial surface of the flange 64. The left-hand or driven end of the lever 66 is rotated by a solenoid actuator 72 including a reciprocally movable cam 74 carried by a plunger armature 76. The armature 74 is reciprocally movable so that an increasing diameter or frustoconical camming surface of the cam 74 and a smaller straight diameter surface move the left-hand or driven end of the lever 66 to counter clockwise and clockwise positions, respectively. The solenoid actuator 72 includes a coil 78 which is energized by suitable electrical signals having opposite polarities as indicated by the directional arrows 80 and 82 in FIGS. 1 and 2, respectively. The electric signals move the armature 76 to an extended and right-hand most position as shown in FIG. 2 or to a retracted and left-hand most position shown in FIG. 1. The clutch closed position is produced by the armature 76 being electromagnetically shifted to the left or retracted position so that the lever arm 66 assumes a clockwise rotated position to be released from the flange 64 of the clutch part 42. The spring 46 biasingly urges the clutch part 42 and the clutch driving and driven parts 30 and 32 together so that the rotations of the gear train 20 are transmitted through the clutch mechanism 14 to the pusher member 36. The clutch open position and uncoupling condition is illustrated in FIG. 2 when the armature 76 is shifted to the right and extended position so that the lever arm 66 assumes a counterclockwise rotated position to drive the flange 64 rearwardly so that the clutch part 42 compresses the spring 46 and is spaced from the clutch driving part 30. The mutually engaging clutch friction surfaces of the clutch parts 30 and 32 are released and disengaged so that no torque is coupled thereacross.

The operation of the clutch mechanism 14 in a time of day or on-peak off-peak manner of watt demand metering provides coupling and extended uncoupling of the rotating measuring element 16 from the pusher member 36 which provides an actuating means for the indicator 40. Typically, the predetermined times of day are selected for measuring which coincide with the peak demand periods of an electric utility supplying the electric energy being monitored by the meter 10. A locally or remotely generated signal produces the electric signals having the polarity or direction of current flow indicated by the directional arrows 80 and 82. When the solenoid actuator 72 is electrically operated to shift the cam 74 to the retracted position as shown in FIG. 1, the lever 66 is rotated so that the end thereof is released from the flange 64 so that the clutch part 42 effects pressure against the clutch parts 30 and 32. The rotations of the rotatable measuring element 16 are then coupled through the gear train 20 and the clutch mechanism 14 to the pusher member 36 and indicator 40, as noted hereinabove. The shaft 28, the spring 46 and clutch parts 30, 32 and 42 and the pusher member 36 all rotate in unison. There is negligible or low amount of mechanical loading or torque applied on the gear train 20 and the measuring element 16 by the clutch mechanism to produce measuring movement of the indicator 40. As is understood in the maximum demand metering art, the pusher member 36 engages and drives the indicator 40 upscale when the measuring element 16 rotates more in one demand interval than it has in any previous demand interval.

When it is desired to open the clutch mechanism 14 to either effect resetting of the pusher member 36, at the end of a predetermined demand interval, or to suspend or interrupt watt demand measurements for an extended time, the solenoid actuator 72 is electrically operated by an electrical signal having the direction or polarity as indicated by the directional arrow 82 in FIG. 2. The cam 74 is extended and the larger diameter cam surface urges the lever arm 66 counterclockwise to slide the clutch part 42 rearward and release the clutch driving part 30 from the clutch driven part 32. The clutch part 42 is spaced and isolated from the clutch part 30 so it is freely rotatable in response to the rotatable measuring element 16 without any appreciable mechanical loading or torque being applied to the gear train 20 or the measuring element 16 due to the clutch opening operation producing the uncoupling condition of the clutch mechanism 14. In the pusher resetting operation, the solenoid actuator 72 is energized to close the clutch after the sector gear 56 drives the pinion gear 52 to the zero position after two to five seconds.

Figure 3:
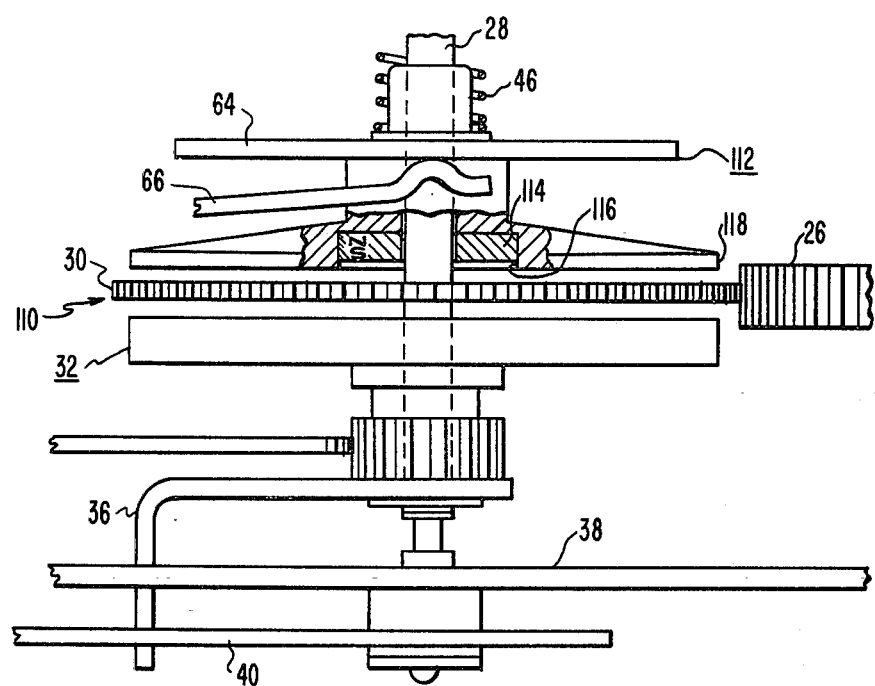
FIG. 3 is an enlarged top plan view, with parts broken away, of an alternative embodiment of the clutch mechanism shown in FIGS. 1 and 2.

FIG. 3 illustrates an alternative clutch mechanism 110 that is capable of replacing the clutch mechanism 14 shown in FIG. 1. Accordingly, the shaft 28 has mounted thereon the clutch parts 30 and 32 in substantially the identical manner as they provided in the clutch mechanism 14. The clutch closing part 112 has the same general configuration as does the corresponding clutch closing part 42 excepting that a low strength permanent magnet 114 is carried in a recess 116 in the pressure plate portion 118 of the clutch part 112. The pressure plate 118 is otherwise the same as the plate 60 and the remaining sleeve and flange portions of the clutch part 112 are the same as in the clutch part 42.

When the mechanism 14 is closed, the flux of the magnet 114 will cause a temporary magnetic coupling between the magnetic material forming the driving part 30 and the magnet 114. When the clutch opening operation is provided, the lever 66 urges the clutch part 112 rearward against the spring 46 and the effect of the magnet 114 is to releasably attract the clutch part 30 so that positive disengagement with the clutch driven part 32 is provided. Any effects causing cohesion or sticking between the mutually engaging friction surfaces of the parts 30 and 32 are thereby overcome. The force of attraction of the magnet 114 for the clutch part 30 is substantially smaller than the frictional force and retarding torque due to the engagement of the tines of the lever 66 with the flange 64. Thus, as the gear train 20 rotates the clutch part 30, the frictional force of the lever 66 on the flange 64 is greater than the magnetic attraction force between the clutch part 112 and the clutch part 30 to cause the clutch part 30 to break free of the clutch part 112 as it is shifted rearward and continue to rotate freely on the shaft 28. Thus, during the initial clutch opening operation produced by the lever 66, the driving part 30 is pulled axially away from the driven part 32 by the attraction of the magnet 114 as the part 110 slides rearward. Further rearward axial movement of the part 110 and the rotations of the part 30 then cause the coupling between the driving part 30 and closing part 112 to be broken.

The clutch mechanism 110 is closed in substantially same manner as disclosed hereinabove for the clutch mechanism 14. Accordingly, clockwise pivoting of the lever 66 permits the spring 46 to bias the clutch parts 112, 30 and 32 together to couple the rotations of the gear train gear 26 to the the associated pusher member 36 and when appropriate, the indicator 40.

While the clutch mechanisms 14 and 110 are described hereinabove for meter registers having a single pointer indicator the clutch mechanisms can be used in a multiple dial pointer register or a cumulative demand type register. Accordingly, preferred embodiments of the invention have been described hereinabove while contemplating that other obvious alternatives and equivalents which would be understood by those skilled in the art may be employed without departing from the spirit and scope of this invention.

We claim:

1. A watt demand meter register for indicating accumulated values of measured electric energy usage, comprising:
   a rotatable measuring element rotated at a rate corresponding to the consumption of the measured electric energy usage quantity;
   a gear train continuously driven by said rotatable measuring element;
   a clutch driven part freely rotatable about an axis of rotation and carrying a pusher member for actuating a watt demand indicator means;
   a clutch closing part freely rotatably about said axis of rotation and being axially shiftable;
   a clutch driving part coaxially mounted between said clutch closing part and said clutch driven part, said clutch driving part freely rotatable about said axis of rotation and being axially shiftable, said clutch driving part being continuously driven by said gear train; and
   a clutch operator means for shifting said clutch closing part between one axial position spaced from said clutch driving part so as to disengage said parts and present minimal loading on said gear train, and another axial position wherein said clutch closing part engages said clutch driving part for effecting a common coupling engagement between said parts.

2. The watt demand meter register as claimed in claim 1 including means releasably coupling said driving part and said closing part so that when said closing part is shifted between said another and said one axial positions said driving part is temporarily shifted rearward by said closing part to effect separation of said driving and said driven parts.

3. The watt demand meter register as claimed in claim 2 wherein said clutch operating means includes a pivotally mounted lever arm selectively engaging and disengaging said clutch closing part to selectively shift said clutch closing part between said one and another axial positions.

4. A watt demand meter register including an indicator for indicating totalized amounts of rotation of a rotatable measuring element during predetermined demand intervals and a clutch mechanism for selectively coupling and uncoupling the indicator with the rotations of the measuring element wherein said clutch mechanism comprises:
a shaft;
a driving part freely rotatable and axially shiftable on said shaft and including a thin disc having an outer gear periphery continuously coupled with the rotations of said measuring element and a side surface;
a driven part mounted in a freely rotatable axially fixed position on said shaft adjacent one side of said driving part and having a side surface frictionally engageable by said side surface of said driving part;
a clutch closing part freely rotatable and axially shiftable on said shaft on the other side of said driving part, said closing part being slidable into engagement with said driving member for clamping said driving member to said driven member to effect coupling therebetween and further slidable away from said driving member to disengage said driving member;
spring biasing means carried on said shaft and urging said clutch closing part toward engagement with said clutch driving part;
a clutch operator including means engageable with said clutch closing part so as to axially slide said closing part to one position against the force of said biasing means to open said clutch mechanism and present minimal loading on said gear train, and to another position releasing said clutch closing part so that said biasing means is effective to close said clutch mechanism; and
pusher means fixedly carried by said driven part so as to provide measuring indications at said indicator in response to maximum numbers of the rotations of said measuring element occurring during said demand intervals exclusively when said clutch mechanism is closed.

5. The watt demand meter register as claimed in claim 4 wherein said clutch closing part includes a weak magnetic means carried in a facing relationship to said driving part for effecting a releasable coupling between said closing part and said driving part.

6. The watt demand meter register as claimed in claim 4 wherein said clutch operator includes a reciprocally movable cam member for selectively actuating said means engageable with said closing part.

7. The watt demand meter register as claimed in claim 6 including a solenoid actuator for effecting reciprocal movement of said cam.

* * * * *